United States Patent
Rowell, Jr. et al.

(10) Patent No.: US 6,417,674 B1
(45) Date of Patent: Jul. 9, 2002

(54) TWO PORT SELF-CALIBRATION FOR AN N-PORT NETWORK ANALYZER

(75) Inventors: Joseph Rowell, Jr., Santa Rosa; Peter F. Mastin, Sebastopol, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/519,529

(22) Filed: Mar. 6, 2000

(51) Int. Cl.$^7$ .............................................. G01R 35/00
(52) U.S. Cl. ..................... 324/601; 324/608; 324/637
(58) Field of Search .............................. 324/601, 608, 324/637, 638

(56) References Cited

U.S. PATENT DOCUMENTS

| | | | |
|---|---|---|---|
| 4,853,613 A | * 8/1989 | Sequeira et al. | 324/601 |
| 5,578,932 A | * 11/1996 | Adamian | 324/601 |
| 5,661,404 A | 8/1997 | Yanagawa et al. | 324/601 |
| 6,147,501 A | * 11/2000 | Chodora | 324/601 |

OTHER PUBLICATIONS

HP8753D Network Analyzer User's Guide from Hewlett–Packard Company, Sep. 95, Chapter 5 and 6.*
HP 8712C and HP 8714C RF Network Analyzer User's Guide, Part No. 08712–90056, available from Hewlett–Packard Company, Oct., 1996, pp. 6–1 through 6–14.

HP8753D Network Analyzer User's Guide, Part No. 08753–90257, available from Hewlett–Packard Company, Sep., 1995, pp. 6–37 through 6–44.

Doug Rytting, *An Analysis of Vector Measurement Accuracy Enhancement Techniques*, Mar. 1992, Appendix.

\* cited by examiner

Primary Examiner—Michael Sherry
Assistant Examiner—Paresh Patel

(57) ABSTRACT

An n-port network analyzer system is calibrated. An initial calibration is performed for each test port in the network analyzer system by first performing a measurement calibration using calibration standards. The calibration standards are located in a reference plane located outside the network analyzer system. The measurement calibration yields initial calibration coefficients. The initial calibration coefficients include Forward Load Match ($LM_F$) and Reverse Load Match ($LM_R$). Electronic standards are measured within the network analyzer system to: produce initial measured electronic standards. The initial calibration coefficients and the initial measured electronic standards are used to generate initial corrected electronic standards. After the initial calibration, automatic re-calibrations are performed periodically. When performing the automatic recalibration, the electronic standards within the network analyzer system are measured to produce recalibration measured electronic standards. The recalibration measured electronic standards and the initial corrected electronic standards are used to produce recalculated calibration coefficients.

15 Claims, 8 Drawing Sheets

TWO PORT SELF-CALIBRATION FOR AN N-PORT NETWORK ANALYZER

RELATED APPLICATION

The subject matter of the present patent application is related to the subject matter set in a co-pending patent application Ser. No. 08/918,340, filed on Aug. 26, 1997 by Jason A. Chodora for AUTOMATIC CALIBRATION OF A NETWORK ANALYZER.

BACKGROUND

The present invention concerns radio frequency and microwave network analyzers and pertains particularly to automatic calibration of a network analyzer.

A radio frequency (RF) network analyzer system consists of a network analyzer and may include a multi-port test set. The network analyzer integrates a synthesized radio frequency source with built-in couplers for signal separation, a narrow band receiver, a display and a processor.

Measurement calibration is a process that improves measurement accuracy by using error correction arrays during signal processing to compensate for systematic measurement errors. Measurement calibration is also called Cal, accuracy enhancement, and error correction. Measurement errors are classified as random and systematic errors. Random errors, such as noise and connector repeatability are non-repeatable and not correctable by measurement calibration.

Systematic errors, such as tracking and crosstalk, are the most significant errors in most RF measurements. Systematic errors are repeatable and for the most part correctable, though small residual errors may remain. These systematic errors may drift with time and temperature.

Systematic errors are due to system frequency response, isolation between the signal paths, and mismatch in the test setup. Frequency response errors (transmission and reflection tracking) are gain errors that are a function of frequency.

Isolation errors result from energy leakage between signal paths in transmission measurements. This leakage is due to crosstalk. In reflection measurements, the leakage is also due to imperfect directivity. Directivity is the ability of the signal separation devices to separate forward traveling signals from reverse traveling signals.

Mismatch errors result from differences between the port impedance of the device under test (DUT) and the port impedance of the network analyzer. Source match errors are produced on the source (network analyzer RF OUT) side of the DUT; load match errors on the load (network analyzer RF IN) side. If the DUT is not connected directly to the ports the mismatch errors due to cables, adapters, etc. are considered part of the source or load match errors.

The network analyzer has several methods of measuring and compensating for these test system errors. Each method removes one or more of the systematic errors using equations called an error model. Measurement of high quality standards (for example, short, open, load, through) allows the network analyzer to solve for the error terms in the error model. The accuracy of the calibrated measurements is dependent on the quality of the standards used and the stability of the measurement system. Since calibration standards are very precise great accuracy can be. achieved.

To perform a transmission calibration, four measurement standards are utilized: for example, an open, a short, a load, and a through cable. The network analyzer measures each standard across a defined frequency band using a pre-defined number of points. The measurement of these standards are used to solve for the error terms in the error model and to remove systematic errors caused by frequency response and source match.

To perform a reflection calibration a one-port calibration is performed using three measurement standards: an open, a short, and a load. The network analyzer measures each standard across a predefined frequency band using a predefined number of points. The measurements of these standards are used to solve for the error terms in the error model and to remove systematic errors caused by directivity, source match and frequency response.

For further information about calibration of network analyzers, see for example, the HP 8712C and HP 8714C RF Network Analyzer User's Guide, Part No. 08712-90056, available from Hewlett-Packard Company, October, 1996, pp. 6-1 through 6-14.

Switching test sets can extend the measurement capability of network analyzers from a single pair of ports to multiple ports, and allows measurement of devices under test in the forward and reverse directions. The test sets allow significant increase of throughput when using a network analyzer to test a device by eliminating manual changing of device connections and enabling complete automation of the test process.

However, the addition of a test set after the network analyzer can significantly degrade the raw performance of the network analyzer system. The characteristics of the test set also drift with temperature. Vector error correction allows the system (composed of the network analyzer and test set) to achieve very good performance, but the drift of the test set makes frequent re-calibrations necessary. For some devices multi-port calibrations can take over 30 minutes to perform, and may need to be repeated frequently, for example, once or twice during an eight-hour shift. This significantly reduces the throughput improvement provided by the switching test set.

Two-port calibration of a network analyzer system using a test set requires external, open, short, load and through standards. The open, short and load must be connected to each port and measured. The through standard must be connected to each possible port pairing and measured in each direction. A four port test set requires six external through connections to complete a two-port calibration. A 12 port test set requires 66 external through connections to complete a two-port calibration. An N-port test set requires N(N-1)/2 external through connections to complete a two-port calibration. Therefore, the time required to perform a two-port calibration increases geometrically with the number of ports used in a multi-port test set. Thus as the number of ports increases, throughput is reduced due to the time spent for calibration.

In order to reduce the time required for calibration various systems have incorporated some automated features. For example U.S. Pat. No. 5,434,511, U.S. Pat. No. 5,467,021, U.S. Pat. No. 5,537,046, U.S. Pat. No. 5,548,221, U.S. Pat. No. 5,552,714 and U.S. Pat. No. 5,578,932 discuss electronic calibration accessories which perform computer-assisted calibrations with electronic standards, making the calibration process less time-consuming and error-prone. However, when using these electronic calibration accessories it is necessary to manually connect a module to the measurement ports. U.S. Pat. No. 5,587,934 also sets out an electronic calibration module that requires manual connections.

U.S. Pat. No. 5,578,932 sets a technique for including electronic calibration in a multi-port test set. This technique, however, appears to use precision-characterized electronic standards. This does now allow for calibration anywhere other than the network analyzer front panel ports.

U.S. Pat. No. 5,548,538 discloses a technique for including calibrations internal to the network analyzer. This technique involves the addition of a precisely characterized two-port module in front of the test set ports. An error matrix is determined for this two-port module relative to known standards at the test set ports. This error matrix can then be used to calculate the reflection coefficients of the electronic calibration standards inside the two-port module and to enable future automatic calibrations.

However, all of these existing techniques, when applied to a multi-port test set, are still very time consuming and complex when used for a full transmission calibration of a multi-port test set.

SUMMARY OF THE INVENTION

In accordance with the preferred embodiment of the present invention, a network analyzer system is calibrated. For example, the network analyzer system includes a radio frequency network analyzer or a microwave network analyzer. An initial calibration is performed for each test port in the network analyzer system. The initial calibration is performed by first performing a measurement calibration using calibration standards. The calibration standards are located in a reference plane located outside the network analyzer system. The measurement calibration yields initial calibration coefficients. The initial calibration coefficients include Forward Load Match ($LM_F$), Forward Isolation ($IS_F$), Reverse Load Match ($LM_R$), and Reverse Isolation ($IS_R$).

Also the initial calibration includes measuring electronic standards within the network analyzer system to produce initial measured electronic standards. The initial calibration coefficients and the initial measured electronic standards are used to generate initial corrected electronic standards.

After the initial calibration, automatic re-calibrations are performed periodically. When performing the automatic recalibration, the electronic standards within the network analyzer system are measured to produce recalibration measured electronic standards. The recalibration measured electronic standards and the initial corrected electronic standards are used to produce recalculated calibration coefficients.

In the preferred embodiment, the initial calibration coefficients additionally include Forward Directivity ($DIR_F$), Forward Source Match ($SM_F$), Forward Reflection Tracking ($RT_F$), Forward Transmission Tracking ($TT_F$), Reverse Directivity ($DIR_R$), Reverse Source Match ($SM_R$), Reverse Reflection Tracking ($RT_R$), and Reverse Transmission Tracking ($TT_R$).

In the preferred embodiment, the forward Load Match ($LM_F$) is derived using the following equation:

$$LM_F = \frac{s11_{measured} - \frac{DIR_F}{TS^2}}{RT_F + (SM_F \times (s11_{measured} - DIR_F))}$$

TS is the transmission response along a path between test ports. $s11_{measured}$ is the measured value at a first port when a signal is placed on the first port and the first port and a second port are connected in a through (thru) path configuration.

In the preferred embodiment, the Reverse Load Match ($LM_R$) is derived using the following equation:

$$LM_R = \frac{s22_{measured} - \frac{DIR_R}{TS^2}}{RT_R + (SM_R \times (s22_{measured} - DIR_R))}$$

$s22_{measured}$ is the measured value at the second port when a signal is placed on the second port and the first port and the second port are connected in the through path configuration.

In the preferred embodiment, Forward Isolation ($IS_F$) is derived by placing a signal on a first port and measuring transmission at a second port, when a load is connected between the first port and the second port. Reverse Isolation ($IS_R$) is derived by placing a signal on the second port and measuring transmission at the first port, when the load is connected between the first port and the second port.

Customers using the two-port self calibration with a multiport test set can increase the throughput of their network analyzer measurements. Unlike many other automatic calibration techniques, internal self calibrations can remove drift of the network analyzer and test set system quickly without manual disconnection of any devices under test. The technique of translating transmission and load match calibrations to non-pair ports reduces the time required for initial multiport calibration. Finally reduction in frequency of manual calibrations improves throughput and increases the automation potential of the test process.

DESCRIPTION OF THE PREFERRED EMBODIMENT

Figure 1:
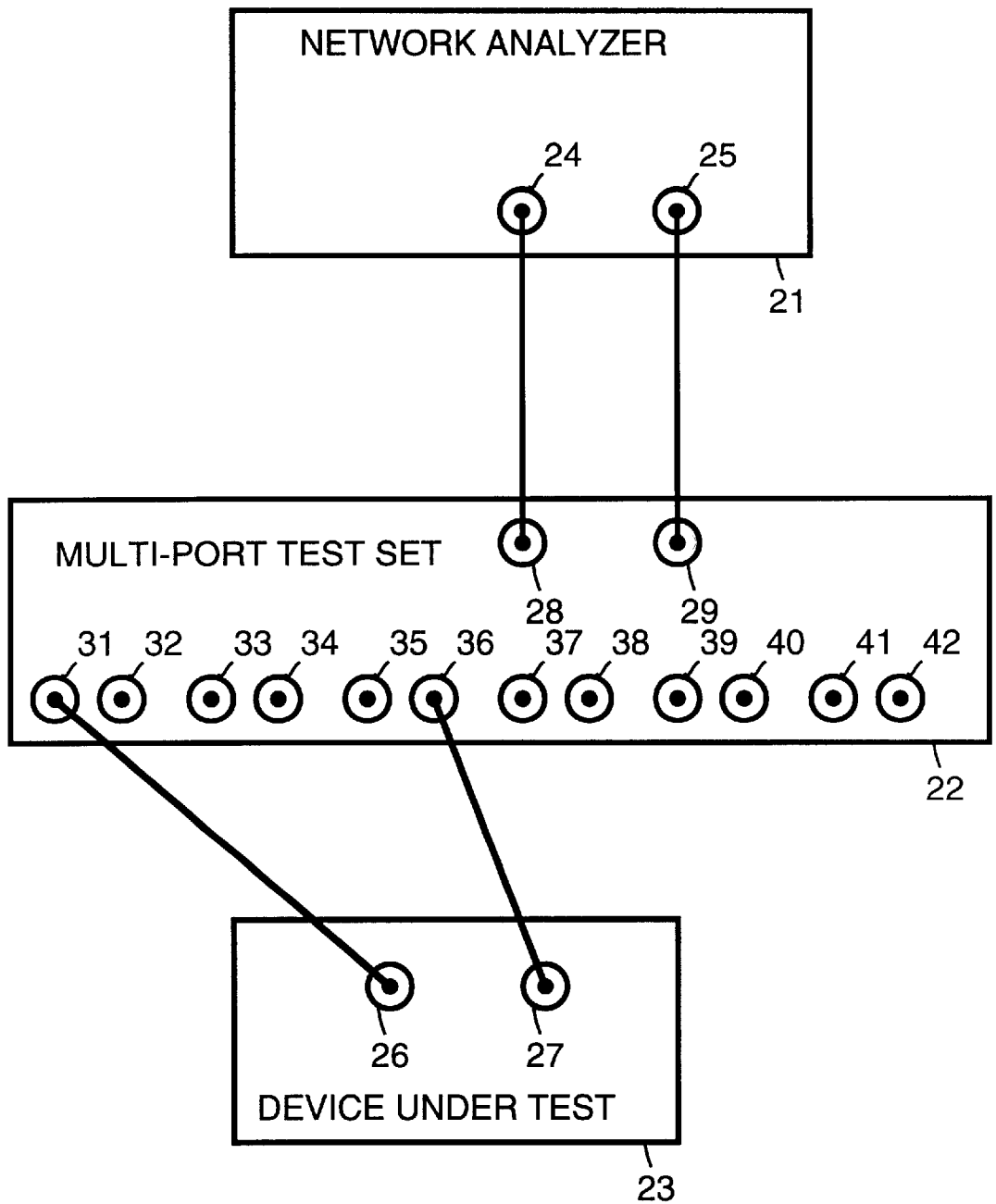
FIG. 1 is simplified block diagram showing connection of a network analyzer to a device under test utilizing a multi-port test set.

FIG. 1 is a simplified block diagram showing a network analyzer system connected to a device under test (DUT) 23. The radio frequency network analyzer system includes a network analyzer 21 connected to a multi-port test set 22. Network analyzer 21 is, for example a radio frequency network analyzer or a microwave network analyzer. The radio frequency network analyzer system is connected to device under test (DUT) 23 utilizing test set ports of multi-port test set 22. DUT 23 has a port 26 and a port 27.

Network analyzer 21 has a radio frequency (RF) out port 24 and a radio frequency (RF) in port 25. In order to perform a test, multi-port test set 22 connects a reflection port 28 to one of test set ports 31, 32, 33, 34, 35, 36, 37, 38, 38, 40, 41 and 42. Likewise, in order to perform a test, multi-port test set 22 connects a transmission port 29 to another of test set ports 31, 32, 33, 34, 35, 36, 37, 38, 38, 40, 41 and 42. While multi-port test set 22 is shown with twelve test set ports, multi-port test set 22 can have, for example, four, six, eight or some other even number of test set ports.

Figure 2:
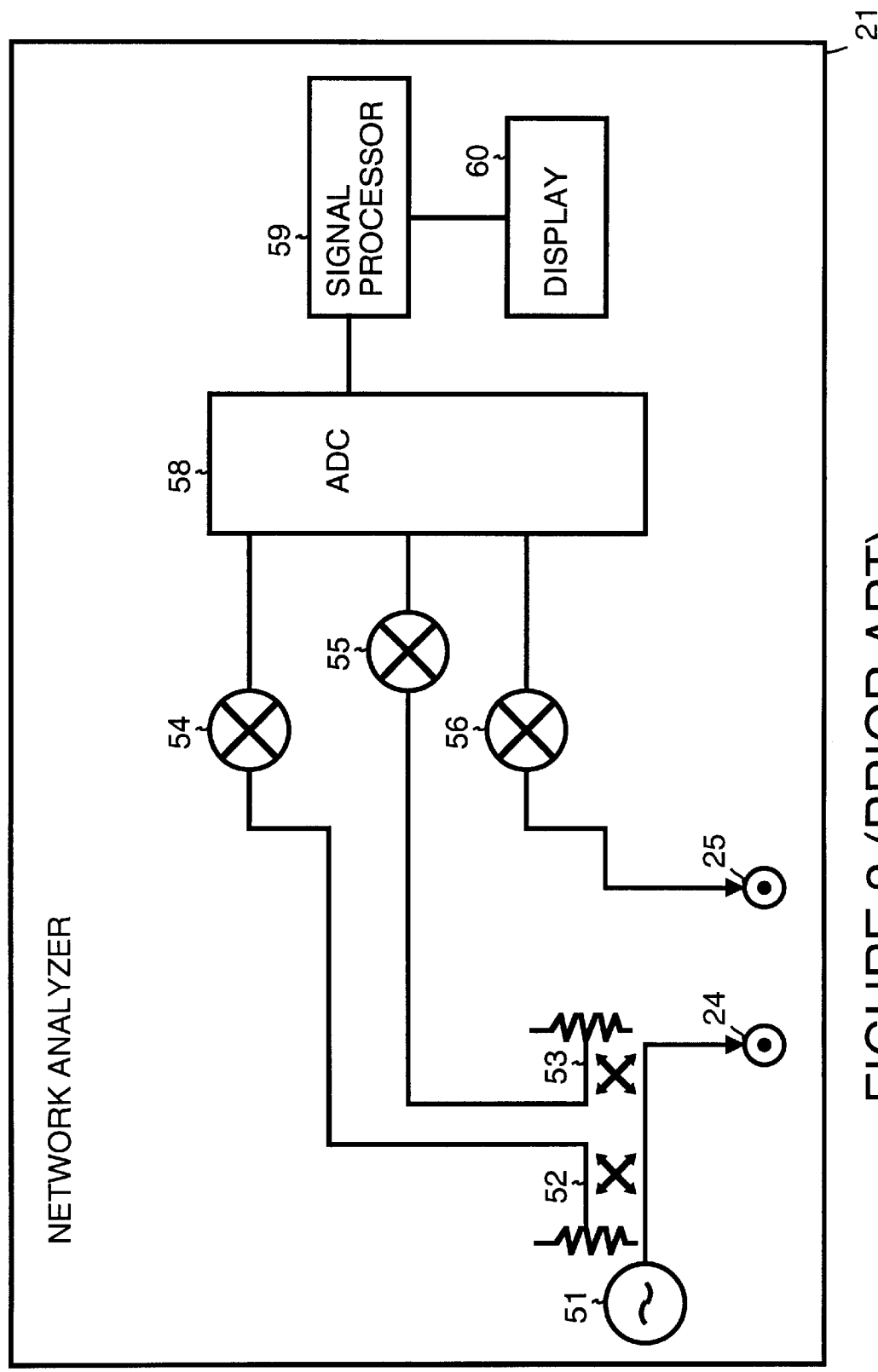
FIG. 2 is a simplified block diagram of a radio frequency network analyzer in accordance with the prior art.

FIG. 2 is a simplified block diagram of radio frequency network analyzer 21 in accordance with the prior art. A radio frequency source 51 provides a radio frequency out signal placed on RF out port 24. The radio frequency out signal is also coupled to a reference signal line 52 and a reflected signal line 53. An analog-to-digital converter (ADC) 58 is connected to a mixer 54, a mixer 56 and a mixer 55. Mixer 55 is connected to reflected signal line 53.

Figure 3:
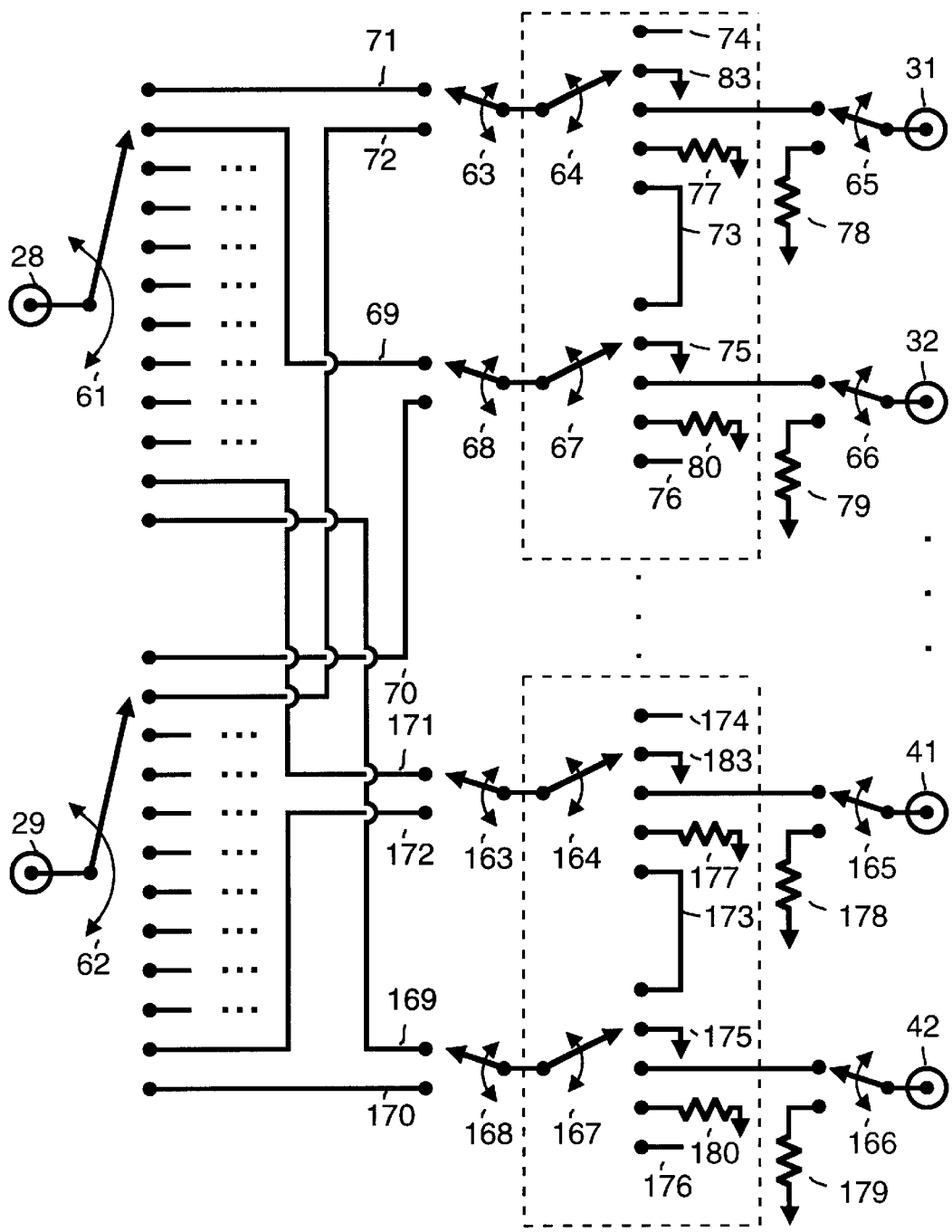
FIG. 3 is a block diagram of a portion of a multi-port test set in accordance with a preferred embodiment of the present invention.

The signals received by analog-to-digital converter 58 are converted to digital signals and forwarded to a signal processor 59. Signal processor 59 processes the signal and displays data on a display 60. Signal processor 59, in the course of processing the signal, uses error correction array data, calculated during calibration, to correct measurement data FIG. 3 is a simplified block diagram of multi-port test set 22 which illustrates electronic standards directly behind the ports of multi-port test set 22. A switch 61 selects an interface from one of test set ports 31, 32, 33, 34, 35, 36, 37, 38, 38, 40, 41 and 42 to be connected to reflection port 28. FIG. 3 shows a line 71 used to connect the interface of test set port 31 to reflection port 28, a line 69 used to connect the interface of test set port 32 to reflection port 28, a line 171 used to connect the interface of test set port 41 to reflection port 28 and a line 169 used to connect the interface of test set port 34 to reflection port 28. The additional lines selectable by switch 61 are used to connect the interface of other test set ports to transmission port 28.

A switch 62 selects an interface from one of test set ports 31, 32, 33, 34, 35, 36, 37, 38, 38, 40, 41 and 42 to be connected to transmission port 29. FIG. 3 shows a line 72 used to connect the interface of test set port 31 to transmission port 29, a line 70 used to connect the interface of test set port 32 to transmission port 29, a line 172 used to connect the interface of test set port 41 to transmission port 29 and a line 17 0 used to connect the interface of test set port 42 to transmission port 29. The additional lines selectable by switch 62 are used to connect the interface of other test set ports to transmission port 29.

A switch 63 selects whether the interface of test set port 31 is connected to line 71 or line 72. A switch 64 selects whether the interface is selected to test set port 31 or to an open 74, short 83, a load 77 or a calibration-through line 73. Open 74, short 83, load 77 and a calibration-through line 73 are used as internal standards for electronic calibration involving test set port 31. Open 74, short 83 and load 77 are reflection standards which allow solution for directivity, source match and reflection tracking. Calibration-through line 73 allows solution for transmission tracking and load match. A switch 65 selects whether test set port 31 is activated or connected to a load 78.

A switch 68 selects whether the interface of test set port 32 is connected to line 69 or line 70. A switch 67 selects whether the interface is selected to test set port 32 to an open 76, a short 75, a load 80 or a calibration-through line 73. Open 76, short 75, load 80 and calibration-through line 73 are used as internal standards for electronic calibration involving test set port 32. Open 76, short 75 and load 80 are reflection standards which allow solution for directivity, source match and reflection tracking. Calibration-through line 73 allows solution for transmission tracking and load match. A switch 66 selects whether test set port 32 is activated or connected to a load 79.

A switch 163 selects whether the interface of test set port 41 is connected to line 171 or line 172. A switch 164 selects whether the interface is selected to test set port 41 or to an open 174, short 183, a load 177 or a calibration-through line 173. Open 174, short 183, load 177 and a calibration-through line 173 are used as internal standards for electronic calibration involving test set port 41. Open 174, short 183 and load 177 are reflection standards which allow solution for directivity, source match and reflection tracking. Calibration-through line 173 allows solution for transmission tracking and load match. A switch 165 selects whether test set port 41 is activated or connected to a load 178.

A switch 168 selects whether the interface of test set port 42 is connected to line 169 or line 170. A switch 167 selects whether the interface is selected to test set port 42 to an open 176, a short 175, a load 180 or a calibration-through line 173. Open 176, short 175, load 180 and calibration-through line 173 are used as internal standards for electronic calibration involving test set port 42. Open 176, short 175 and load 180 are reflection standards which allow solution for directivity, source match and reflection tracking. Calibration-through line 173 allows solution for transmission tracking and load match. A switch 166 selects whether test set port 42 is activated or connected to a load 179.

A port pair is a pair of ports that is associated with a calibration-through line. For example, as shown in FIG. 3, Port 31 and port 32 are a port pair associated with calibration-through line 73. Likewise, as shown in FIG. 3, Port 41 and port 42 are a port pair associated with calibration-through line 173. When making transmission and load match measurements pertaining to the port pair of port 31 and port 32, switches 64 and 67 select calibration-through line 73. When making transmission and load match measurements pertaining to the port pair of port 41 and port 42, switches 164 and 167 select calibration-through line 173.

In the preferred embodiment, before performing automatic calibration, an initial calibration is made.

Figure 4:
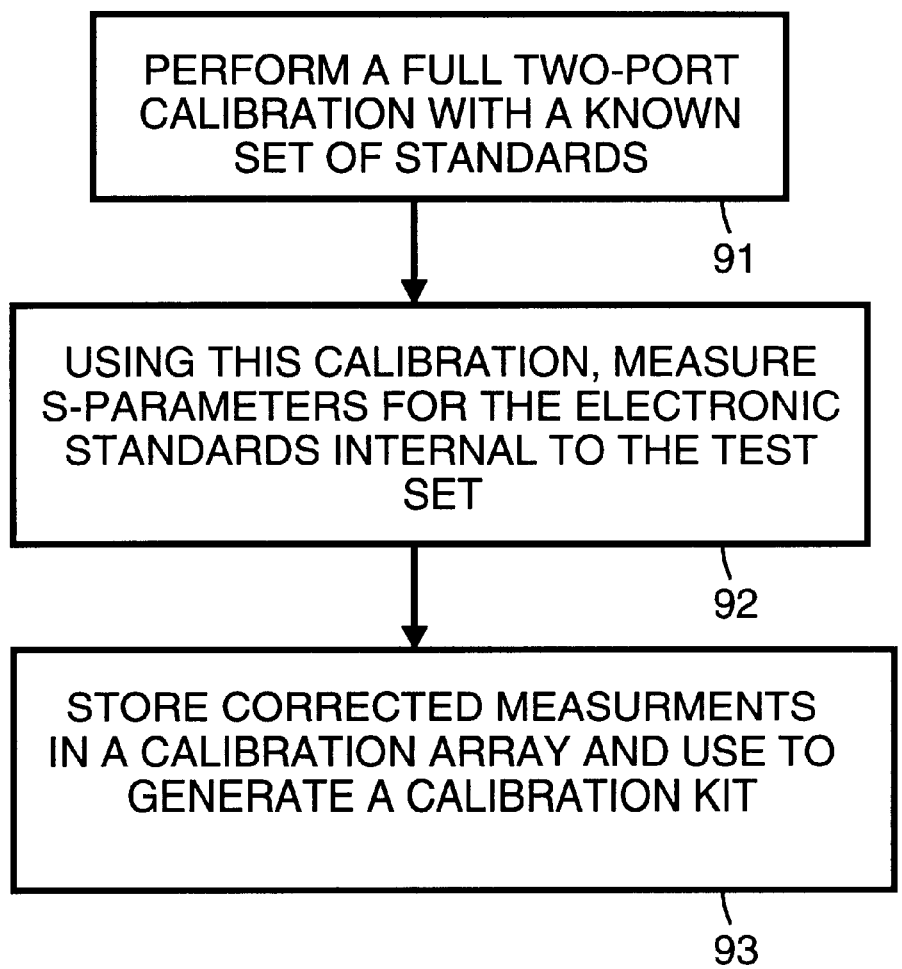
FIG. 4 is a flowchart which illustrates how initial calibration is performed in accordance with the preferred embodiment of the present invention.

FIG. 4 illustrates how the initial calibration is performed. In a step 91, a full two-port calibration is performed with a known set of standards. This calibration can be at any reference plane and can be for any even number of ports. In the preferred embodiment, an open, a short, a load are measured for both ports in every port pair. In addition a through is measured in each direction when the port pairs are connected.

For example, for a port pair consisting of a port 1 paired with a port 2, the following twelve measurements are made using external standards with known values.

TABLE 1

| | |
|---|---|
| s11 | OPEN |
| | For an open circuit, a signal is placed on port 1 and the reflection is measured at port 1. |
| s22 | OPEN |
| | For an open circuit, a signal is placed on port 2 and the reflection is measured at port 2. |

TABLE 1-continued

| | |
|---|---|
| s11 | SHORT<br>For a short circuit, a signal is placed on port 1 and the reflection is measured at port 1. |
| s22 | SHORT<br>For a short circuit, a signal is placed on port 2 and the reflection is measured at port 2. |
| s11 | LOAD<br>For a load circuit, a signal is placed on port 1 and the reflection is measured at port 1. |
| s22 | LOAD<br>For a load circuit, a signal is placed on port 2 and the reflection is measured at port 2. |
| s21 | LOAD (Isolation Term)<br>For a load circuit, a signal is placed on port 1 and the transmission is measured at port 2. |
| s12 | LOAD (Isolation Term)<br>For an load circuit, a signal is placed on port 2 and the transmission is measured at port 1. |
| s11 | THRU (Load Match Term)<br>For a thru circuit, a signal is placed on port 1 and the reflection is measured at port 1. |
| s22 | THRU (Load Match Term)<br>For a through circuit, a signal is placed on port 2 and the reflection is measured at port 2. |
| s21 | THRU<br>For a through circuit, a signal is placed on port 1 and the transmission is measured at port 2. |
| s12 | THRU<br>For a through circuit, a signal is placed on port 2 and the transmission is measured at port 1. |

Using the measurements, twelve correction term coefficients (also called calibration coefficients) are derived, six for each port. The twelve correction term coefficients are set out in Table 2 below:

TABLE 2

Port 1:

Forward Directivity (DIR$_F$)
Forward Source Match (SM$_F$)
Forward Reflection Tracking (RT$_F$)
Forward Transmission Tracking (TT$_F$)
Forward Load Match (LM$_F$)
Forward Isolation (IS$_F$)

Port 2:

Reverse Directivity (DIR$_R$)
Reverse Source Match (SM$_R$)
Reverse Reflection Tracking (RT$_R$)
Reverse Transmission Tracking (TT$_R$)
Reverse Load Match (LM$_R$)
Reverse Isolation (IS$_R$)

The twelve error correction term coefficients are derived using the equations set out below. Equation 1 is used to derive Forward Directivity (DIR$_F$), Forward Source Match (SM$_F$) and Forward Reflection Tracking (RT$_F$).

$$s11_{measured} = DIR_F + \frac{s11_{actual} \times RT_F}{1 - (SM_F \times s11_{actual})} \quad \text{Equation 1}$$

In Equation 1, $s11_{measured}$ is the measured value of s11. $s11_{actual}$ is the actual value of the measured external standard. In order to solve for the three correction term coefficients (DIR$_F$,SM$_F$,RT$_F$), three standards are measured. The three measurements made are s11 OPEN, s11 SHORT and s11 LOAD as are further described in Table 1 above. This provides three equations and three unknowns. See Doug Rytting, *An Analysis of Vector Measurement Accuracy Enhancement Techniques*, March 1992, Appendix.

Thus each test set port interface includes circuits approximating an open, short and load. For example, for test set port 32, open 76 is used for the open, short 75 is used for the short and load 80 is used for the load. For example, for test set port 31, open 74 is used for the open, short 83 is used for the short and load 77 is used for the load. An open, short and load were used for ease of circuit implementation, but any three standards could be used as long as they each present impedances that are substantially different. For more information on generating the coefficients, see HP8753D *Network Analyzer User's Guide*, Part No. 08753-90257, available from Hewlett-Packard Company, September, 1995, pp. 6–37 through 6–44.

To calculate Forward Transmission Tracking (TT$_F$), an enhanced response calibration (correcting source match and frequency response) is used. The calibration-through path that can be switched between pairs is used. The calibration-through path provides the transmission path for both initial calibration and self-calibration. For example, calibration-through line 73 serves as a calibration through path for the pair of test set port 31 and test set port 32.

Equation 2 below is used to derive Forward Transmission Tracking (TT$_F$).

$$s21_{actual} = \frac{s21_{measured}}{TT_f \times (1 - SM_f \times s11_{actual})} \quad \text{Equation 2}$$

In Equation 2, $s21_{measured}$ is the measured value of s21 for a through connection. $s21_{actual}$ is the actual value of the measured external standard for a through connection. When calculating Forward Transmission Tracking (TT$_F$), only one measurement is required because Forward Source Match (SM$_F$) and $s11_{actual}$ has already been calculated and the value of $s11_{actual}$ is known.

Equation 3 is used to derive Reverse Directivity (DIR$_R$), Reverse Source Match (SM$_R$) and Reverse Reflection Tracking (RT$_R$).

$$s22_{measured} = DIR_R + \frac{s22_{actual} \times RT_R}{1 - (SM_R \times s22_{actual})} \quad \text{Equation 3}$$

In Equation 3, $s22_{measured}$ is the measured value of s22. $s22_{actual}$ is the actual value of the measured external standard. In order to solve for the three correction term coefficients, three standards are measured. The three measurements made are s22 OPEN, s22 SHORT and s22 LOAD as are further described in Table 1 above.

To calculate Reverse Transmission Tracking (TT$_R$), an enhanced response calibration (correcting source match and frequency response) is used. The calibration-through path that can be switched between pairs is used. The calibration-through path provides the transmission path for both initial calibration and self-calibration. For example, calibration-through line 73 serves as a calibration through path for the pair of test set port 31 and test set port 32.

Equation 4 below is used to derive Reverse Transmission Tracking (TT$_R$).

$$s12_{actual} = \frac{s12_{measured}}{TT_R \times (1 - SM_R \times s22_{actual})} \quad \text{Equation 4}$$

In Equation 4, $s12_{measured}$ is the measured value of s12 for a through configuration. $s12_{actual}$ is the actual value of the measured external standard for a through configuration.

When calculating Reverse Transmission Tracking ($TT_R$), only one measurement is required because Reverse Source Match ($SM_R$) and the value of $s22_{actual}$ is known.

Equation 5 below is used to derive Forward Load Match ($LM_F$):

$$LM_F = \frac{s11_{measured} - \frac{DIR_F}{TS^2}}{RT_F + (SM_F \times (s11_{measured} - DIR_F))} \quad \text{Equation 5}$$

In equation 5, TS is the transmission response along a path between test ports. This term is measured once and remains a constant. When calculating Forward Load Match ($LM_F$), $s11_{measured}$ is the measured value of s11 measured when port 1 and port 2 are connected in a through path configuration.

Equation 6 below is used to derive Reverse Load Match ($LM_R$):

$$LM_R = \frac{s22_{measured} - \frac{DIR_R}{TS^2}}{RT_R + (SM_R \times (s22_{measured} - DIR_R))} \quad \text{Equation 6}$$

In equation 6, TS is the transmission response along a path between test ports. This term is measured and remains a constant. When calculating Reverse Load Match ($LM_R$), $s22_{measured}$ is the measured value of s22 measured when port 2 and port 1 are connected in a through path configuration.

Forward Isolation ($IS_F$) is the measured value of s21 LOAD as described in Table 1 above. Reverse Isolation ($IS_R$) is the measured value of s12 LOAD as described in Table 1 above.

Once the twelve correction term coefficients have been derived (as described above) in a step 92, the same twelve measurements (listed in Table 1) are made using the internal standards (open, short, load, thru).

In a step 93, the results of the twelve measurements (called the "Test Set Cal") are used to generate corrected measurement terms which are stored in a calibration array as part of a calibration kit. The corrected measurement terms are also called initial measured electronic standards. The twelve corrected measurement terms are set out in Table 3 below:

TABLE 3

| | | |
|---|---|---|
| $s11_{corrected}$ | OPEN | |
| $s22_{corrected}$ | OPEN | |
| $s11_{corrected}$ | SHORT | |
| $s22_{corrected}$ | SHORT | |
| $s11_{corrected}$ | LOAD | |
| $s22_{corrected}$ | LOAD | |
| $s21_{corrected}$ | LOAD | (Isolation Term) |
| $s12_{corrected}$ | LOAD | (Isolation Term) |
| $s11_{corrected}$ | THRU | (forward offset load match ($OLM_F$)) |
| $s22_{corrected}$ | THRU | (reverse offset load match ($OLM_R$)) |
| $s21_{corrected}$ | THRU | |
| $s12_{corrected}$ | THRU | |

The corrected measurement terms $s11_{corrected}$ OPEN, $s11_{corrected}$ SHORT and $s11_{corrected}$ LOAD are derived respectively from $s11_{measured}$ OPEN, $s_{measured}$ SHORT and $s_{measured}$ LOAD using Equation 7 below:

$$s11_{corrected} = \frac{s11_{measured} - DIR_F}{RT_F + SM_F(s11_{measured} - DIR_F)} \quad \text{Equation 7}$$

In Equation 7, $s11_{measured}$ is the measured value of s11 when measuring the open, short and load internal standards.

The corrected measurement term $s21_{corrected}$ THRU is derived from $s21_{measured}$ THRU, and $s11_{measured}$ THRU using Equation 8 below:

$$s21_{corrected} = \frac{s21_{measured}}{TT_f \times (1 - SM_f \times s11_{corrected})} \quad \text{Equation 8}$$

In Equation 8, $s21_{measured}$ is the measured value of s21 when measuring THRU when a signal is placed on port 1 and the transmission is measured at port 2. $s11_{measured}$ THRU is generated using Equation 7 as described above.

The corrected measurement terms $s22_{corrected}$ OPEN, $s22_{corrected}$ SHORT and $s22_{corrected}$ LOAD are derived respectively from $s22_{measured}$ OPEN, $s22_{measured}$ SHORT and $s22_{measured}$ LOAD using Equation 9 below:

$$s22_{corrected} = \frac{s22_{measured} - DIR_R}{RT_R + SM_R(s22_{measured} - DIR_R)} \quad \text{Equation 9}$$

In Equation 9, $s22_{measured}$ is the measured value of s22 when measuring the open, short and load internal standards.

The corrected measurement term $s12_{corrected}$ THRU is derived from $s12_{measured}$ THRU, and $s22_{measured}$ THRU using Equation 10 below:

$$s12_{corrected} = \frac{s12_{measured}}{TT_R \times (1 - SM_R \times s22_{corrected})} \quad \text{Equation 10}$$

In Equation 10, $s12_{measured}$ is the measured value of s12 when measuring THRU when a signal is placed on port 2 and the transmission is measured at port 1. $s22_{measured}$ THRU is generated using Equation 9 as described above.

The load match error correction is derived as follows. For example, a forward offset load match ($OLM_F$) is derived from Equation 11 below:

$$OLM_F = LM_F(\text{external}) - LM_F(\text{internal}) \quad \text{Equation 11}$$

$LM_F$ (external) is the derived value of $LM_F$ when $s11_{measured}$ is the measured value of s11 measured when port 1 and port 2 are connected in an external through path configuration. $LM_F$ (internal) is the derived value of $LM_F$ when $s11_{measured}$ is the measured value of s11 measured when port 1 and port 2 are connected in an internal through path configuration.

Likewise reverse offset load match ($OLM_R$) is derived from Equation 12 below:

$$OLM_R = LM_R(\text{external}) - LM_R(\text{internal}) \quad \text{Equation 12}$$

$LM_R$ (external) is the derived value of $LM_R$ when $s22_{measured}$ is the measured value of s22 measured when port 2 and port 1 are connected in an external through path configuration. $LM_R$ (internal) is the derived value of $LM_R$ when $s22_{measured}$ is the measured value of s22 measured when port 2 and port 1 are connected in an internal through path configuration.

Forward offset load match ($OLM_F$) and reverse offset load match ($OLM_R$) are stored in the calibration array.

More generally, changes in the physical test set reflection port path are mathematically removed by the fundamental load match equation set out as equations 5 and 6 above. As physical path is changed, the correction re-establishes the calibration plane. The reflection port path changes are removed. Load Match is constant and does not change as a result of reflection port path changes.

However, changes in the physical test set transmission port path do change the load match correction term. This error can be removed by maintaining a mathematical relationship between the load match measured using the mechanical standards and the load match measured using the internal standards (i.e., as set out in equations 14 and 15 below). This is used to remove load match errors caused by changes inside the test set, during 2-Port self calibration.

Figure 8:
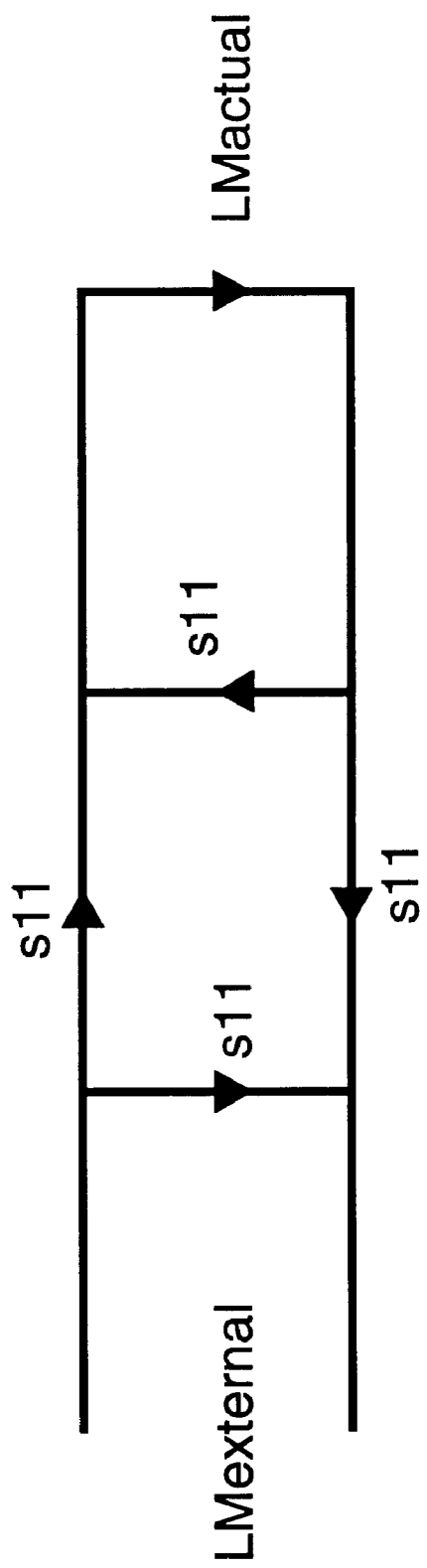
FIG. 8 is used to illustrate measurement of load match using the one port measurement model.

In the initial calibration, the 1-Port model is used to describe the insertion of an external length of cable between the two measurements of load match. This is illustrated by FIG. 8. Load_match_external (LMexternal) is the load match seen with a length of cable inserted. Load_match_actual (LMactual) is the load match seen using the internal standards and without the length of cable.

For a length of inserted cable, derivation of offset load match is as set out in Equations 13 below. In Equations 13, it is assumed that s12 is approximately equal to s21.

Load_match_external=s11_external+((s21)$^2$*Load_match_internal)/(1−s22*Load_match_actual)

Load_match_external≅s11_external+(s21)$^2$*Load_match_actual      Equations 13

. . . when the square terms are small and tend toward zero, they are removed:

Load_match_external≅s11_external+Load_match_actual+Load_match_actual*((s21)$^2$−1)

. . . Load_match_internal is related to Load_match_mechanical by an offset when the term ((s21)$^2$−1) is small enough. s21 is typically very close to 1. (A semi-rigid coax is recommended to achieve this but other low loss cables will also work).

Load_match_external _s11_external+Load_match_actual

Offset_load_match≅s11_external.

Offset_load_match is used to recalculate the load match correction during self calibration.

In order to measure the two isolation terms (s21 LOAD and s12 LOAD in Table 1), the transmission response is measured when both the source and receiver ports are terminated by loads. This measurement is used in the 2-port correction equations without modification.

Drift of the hardware in network analyzer 21 and multi-port test set 22 causes a loss of measurement accuracy. On a periodic basis, for example, during every half hour of use, an automatic internal recalibration is performed to restore the initial accuracy of the calibrated system. Internal recalibration uses the results of the initial calibration (Test Set Cal) to restore network analyzer 21 to its initial accuracy.

Figure 5:
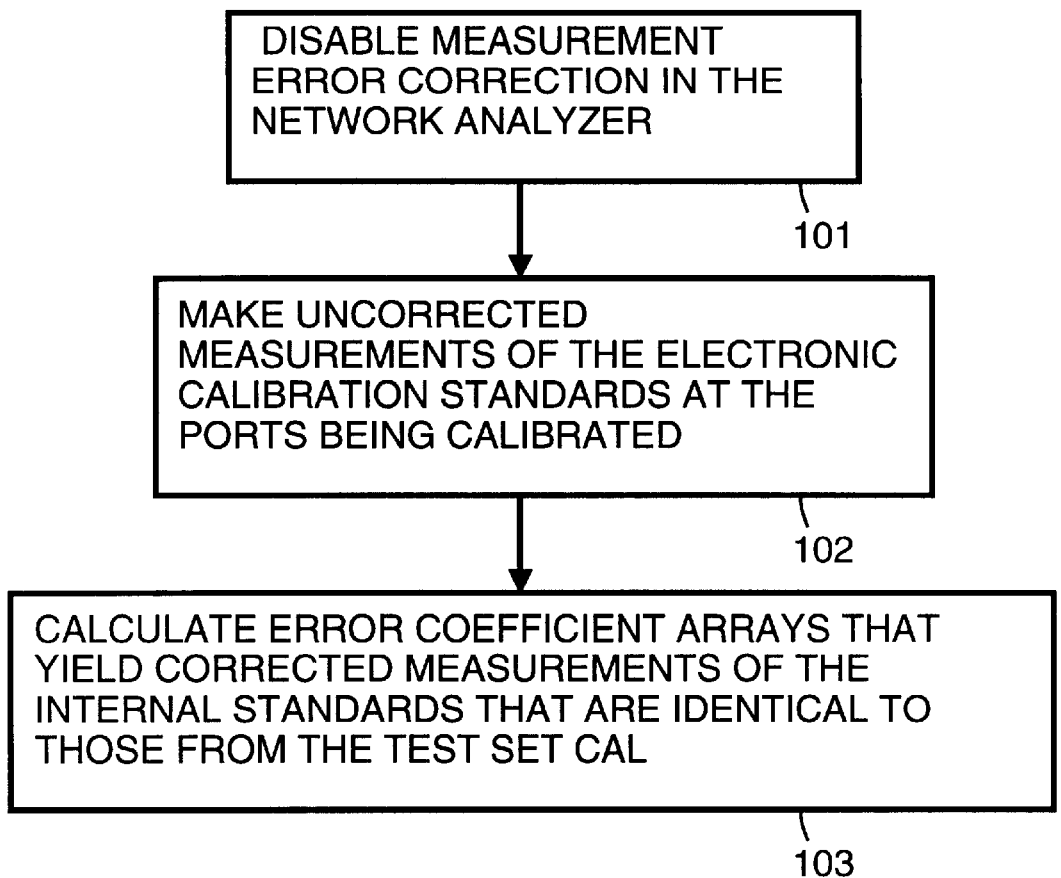
FIG. 5 is a flowchart which illustrates automatic re-calibration in accordance with the preferred embodiment of the present invention.

FIG. 5 is a flowchart which illustrates internal recalibration. In a step 101, measurement error correction in network analyzer 21 is disabled. In a step 102, uncorrected measurements are made of the electronic calibration standards at the ports being calibrated. The uncorrected measurements are the measurements set out in Table 1 above, using the internal standards (open, short, load, thru).

In a step 103, the twelve error correction term coefficients are adjusted/recalculated so that the uncorrected measurements from step 102, used in conjunction with equations 7 through 11 generate the same values for the corrected measurement terms (set out in Table 3) that were originally stored in the calibration array as part of the calibration kit. The twelve error correction term coefficients are stored in the network analyzer for future error correction.

The twelve error correction term coefficients are calculated using equations 1 through 6 as described above with the only difference being that the corrected values ($s11_{corrected}$, $s22_{corrected}$, $s21_{corrected}$, $s12_{corrected}$) are used in the equations instead of the actual values ($s11_{actual}$, $s22_{actual}$, $s21_{actual}$, $s12_{actual}$).

The internal load match is re-computed from the measurement of the internal THRU standard and the 1-Port correction arrays from internal short, open and load. The stored value for forward offset load match ($OLM_F$) is used with the re-computed internal load match to generate a value for external load match to be used in self calibration in accordance with Equation 14 below:

$$LM_F(\text{self\_cal})=LM_F(\text{internal})+OLM_F \qquad \text{Equation 14}$$

The stored value for reverse offset load match ($OLM_R$) is used with the re-computed internal load match to generate a value for external load match to be used in self calibration in accordance with Equation 15 below:

$$LM_R(\text{self\_cal})=LM_R(\text{internal})+OLM_R \qquad \text{Equation 15}$$

After automatic re-calibration, corrected measurements of the internal standards are identical to those from the Test Set Cal. Therefore, measurement drift of the network analyzer hardware and the test set hardware, up to the internal standards, has been removed, A complete two-port calibration of a 12-port test set normally requires characterization of all possible transmission and load match paths which requires 66 through connections for the calibration. The algorithm for two-port calibration in the preferred embodiment of the present invention allows the complete two-port calibration of a 12-port test set with 6 through connections. This is accomplished by using the internal self calibration standards in conjunction with the Test Set Cal to separate the pair ports and allow them to be self calibrated with non-pair ports. The pair ports are the ports between which the thru standard has been measured during Test Set Cal.

The procedure for self calibration of non-pair ports follows that used for enhanced response self calibration of non-pair ports in determining the reflection error correction arrays. The translation of transmission tracking from a pair port to a non-pair port uses the same correction factor as with the enhanced response technique. The transmission tracking term in two-port self calibration requires a load match term to be translated from the pair port to the non-pair port.

Figure 6:
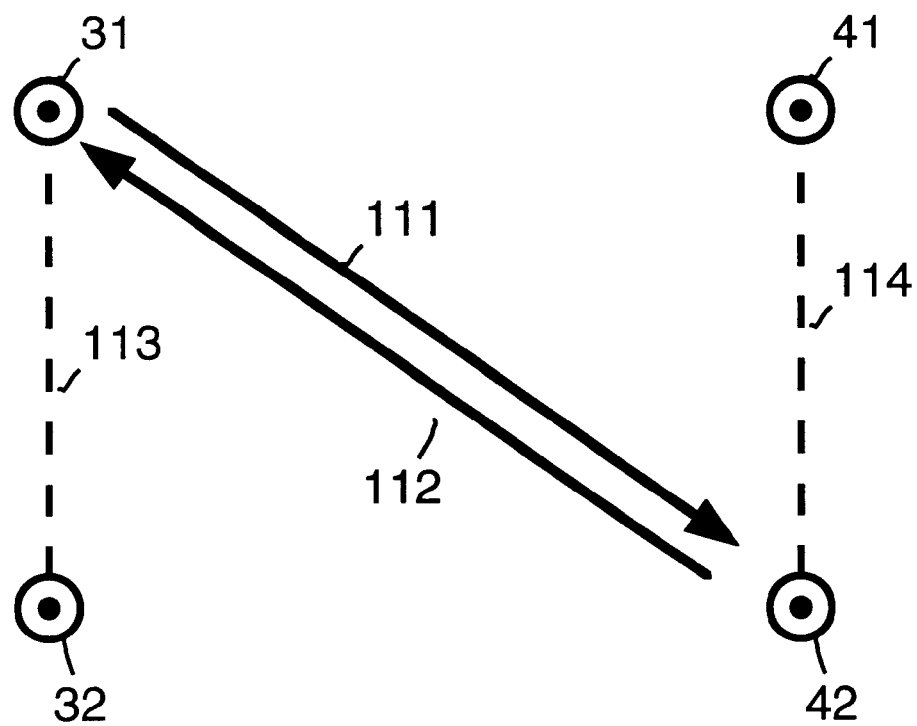
FIG. 6 is simplified block diagram which illustrates a transmission tracking term in two-port self calibration requiring load match translation in accordance with the preferred embodiment of the present invention.
Figure 7:
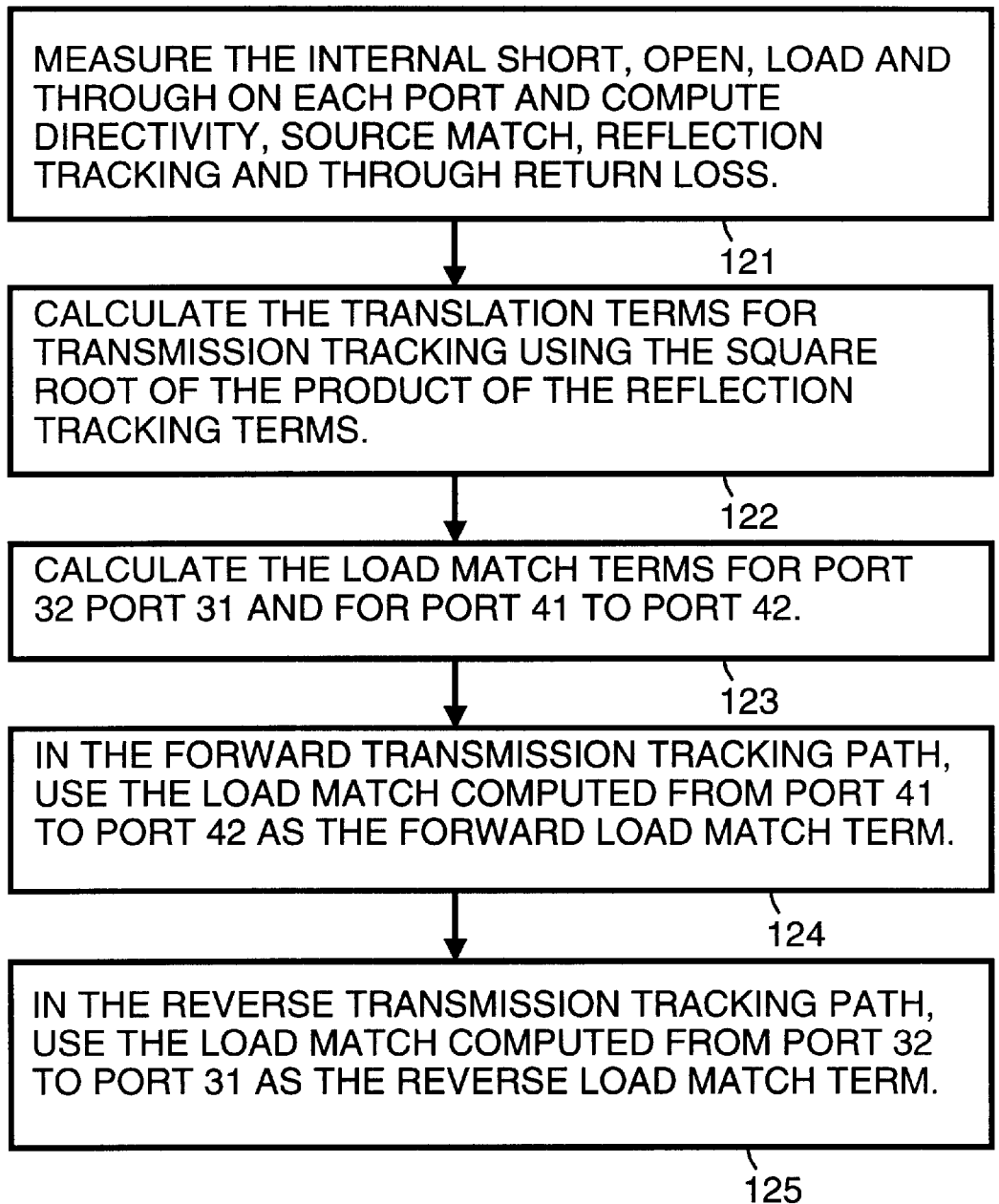
FIG. 7 is a flowchart which illustrates load match translation in accordance with the preferred embodiment of the present invention.

This is illustrated in FIG. 6 where test set port 31 and test set port 32 are a pair port and test set port 41 and test set port 42 are a pair port. The load match translation is to test set port 31 and test set port 42. The translation procedure utilizes the steps set out in the flowchart shown in FIG. 7.

In a step 121, the internal short, open, load and through on each port. Directivity, source match, reflection tracking and through return loss are computed.

In a step 122, the translation terms for transmission tracking are computed using the square root of the product of the reflection tracking terms.

In a step 123, the load match terms for port 32 to port 31 is calculated. This is represented in FIG. 6 by dotted line 113. The load match terms for port 31 to port 32 is also calculated. This is represented in FIG. 6 by dotted line 114.

In a step 124, in the forward transmission tracking path (represented in FIG. 6 by an arrow 111), the load match computed from port 41 to port 42 is used as the forward load match term.

In a step 125, in the reverse transmission tracking path (represented in FIG. 6 by an arrow 112), the load match computed from port B to port A is used as the reverse load match term.

The transmission tracking and load match terms are thus translated to the non-pair ports, allowing calibrated measurements and system drift correction at these ports, After the automatic re-calibration, corrected measurements of the internal standards will be identical to those from the initial calibration. The automatic re-calibration allows removal of the measurement drift of the reflectometer within network analyzer 21 and all hardware in the test set signal path within multi-port test set 22 up to the location of the internal standards used for the calibrations. The only sources of drift in the signal path that can not be removed are the drift of the internal standards themselves, and the cables, connectors and fixturing which occur in the signal path after the standards within multi-port test set 22.

The above has described calibration of a radio frequency network analyzer system which includes a multi-port test set. For a network analyzer system which does not include a multi-port test set, the electronic standards are moved within network analyzer 21 behind RF out port 24 and RF in port 25. In this case, the initial calibration and automatic re-calibration described are performed using out port 24 and RF in port 25. In this case, out port 24 and RF in port 25 are the test ports of the network analyzer system.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for performing calibration of a network analyzer system, the method comprising the following steps:

(a) performing an initial calibration for test ports of the network analyzer system comprising the following substeps:

(a.1) performing a measurement calibration using calibration standards, the calibration standards being located in a reference plane located outside the network analyzer system, the measurement calibration yielding initial calibration coefficients, the initial calibration coefficients including:

Forward Load Match ($LM_F$)

Reverse Load Match ($LM_R$)

(a.2) measuring electronic standards within the network analyzer system to produce initial measured electronic standards, the initial measured electronic standards including:

Forward Offset Load Match ($OLM_F$) and

Reverse Offset Load Match ($OLM_R$), and (a.3) using the initial calibration coefficients and the measured electronic standards to generate initial corrected electronic standards; and, (b) performing an automatic recalibration for the test ports, the automatic recalibration being performed after initial calibration of all the test ports in step (a), the automatic recalibration being performed without accessing calibration standards located in a reference plane located outside the network analyzer system and the automatic recalibration comprising the following substeps:

(b.1) measuring the electronic standards within the network analyzer system to produce recalibration measured electronic standards, and (b.2) using the recalibration measured electronic standards and the initial corrected electronic standards to produce recalculated calibration coefficients, wherein Forward Offset Load Match ($OLM_F$) is used to produce a recalibration Forward Load Match ($LM_F$) and Reverse Offset Load Match ($OLM_R$) is used to produce a recalibration Reverse Load Match ($LM_R$).

2. A method as in claim 1 wherein in substep (a.1) the initial calibration coefficients additionally include:

Forward Directivity ($DIR_F$)

Forward Source Match ($SM_F$)

Forward Reflection Tracking ($RT_F$)

Forward Transmission Tracking ($TT_F$)

Reverse Directivity ($DI_R$)

Reverse Source Match ($SM_R$)

Reverse Reflection Tracking ($RT_R$)

Reverse Transmission Tracking ($TT_R$).

3. A method as in claim 1 wherein in substep (a. 1) forward Load Match ($LM_F$) is derived using the following equation:

$$LM_F = \frac{s11_{measured} - \frac{DIR_F}{TS^2}}{RT_F + (SM_F \times (s11_{measured} - DIR_F))}$$

where TS is the transmission response along a path between test ports and $s11_{measured}$ is the measured value at a first port when a signal is placed on the first port and the first port and a second port are connected in a through path configuration.

4. A method as in claim 1 wherein in substep (a.1) reverse Load Match ($LM_R$) is derived using the following equation:

$$LM_R = \frac{s22_{measured} - \frac{DIR_R}{TS^2}}{RT_R + (SM_R \times (s22_{measured} - DIR_R))}$$

where $s22_{measured}$ is the measured value at the second port when a signal is placed on the second port and the first port and the second port are connected in the through path configuration.

5. A method as in claim 1 wherein in substep (a.1) Forward Isolation ($IS_F$) is derived by placing a signal on a first port and measuring transmission at a second port, when a load is connected between the first port and the second port.

6. A method as in claim 5, wherein in substep (a.1) Reverse Isolation ($IS_R$) is derived by placing a signal on the second port and measuring transmission at the first port, when the load is connected between the first port.

7. A method as in claim 1 wherein in substep (a.1) the initial calibration coefficients additionally include:

Forward Isolation ($IS_F$)

Reverse Isolation ($IS_R$).

8. A method as in claim 1 wherein in substep (b.2) Forward Offset Load Match (OLM$_F$) is used with a re-computed internal forward load match (LM$_F$ (internal)) to produce a recalibration Forward Load Match (LM$_F$ (self_cal)) using the following equation:

$$LM_F(\text{self\_cal}) = LM_F(\text{internal}) + OLM_F.$$

9. A method as in claim 1 wherein in substep (b.2) Reverse Offset Load Match (OLM$_R$) is used with a re-computed internal reverse load match (LM$_R$ (internal)) to produce a recalibration Reverse Load Match (LM$_R$ (self_cal)) using the following equation:

$$LM_R(\text{self\_cal}) = LM_R(\text{internal}) + OLM_R.$$

10. A method for performing calibration of a network analyzer system, the method comprising the following steps:
(a) performing an initial calibration for test ports of the network analyzer system comprising the following substeps:
(a.1) performing a measurement calibration using calibration standards, the calibration standards being located in a reference plane located outside the network analyzer system, the measurement calibration yielding initial calibration coefficients, the initial calibration coefficients including:
Forward Load Match (LM$_F$)
(a.2) measuring electronic standards within the network analyzer system to produce initial measured electronic standards, including:
Forward Offset Load Match (OLM$_F$) and
(a.3) using the initial calibration coefficients and the measured electronic standards to generate initial corrected electronic standards; and,
(b) performing an automatic recalibration for the test ports, the automatic recalibration being performed after initial calibration of all the test ports in step (a), the automatic recalibration being performed without accessing calibration standards located in a reference plane located outside the network analyzer system and the automatic recalibration comprising the following substeps:
(b.1) measuring the electronic standards within the network analyzer system to produce recalibration measured electronic standards, and
(b.2) using the recalibration measured electronic standards and the initial corrected electronic standards to produce recalculated calibration coefficients, wherein Forward Offset Load Match (OLM$_F$) is used to produce a recalibration Forward Load Match (LM$_F$).

11. A method as in claim 10 wherein in substep (b.2) Forward Offset Load Match (OLM$_F$) is used with a re-computed internal forward load match (LM$_F$ (internal)) to produce a recalibration Forward Load Match (LM$_F$ (self cal)) using the following equation:

$$LM_F(\text{self\_cal}) = LM_F(\text{internal}) + OLM_F.$$

12. A method as in claim 10 wherein in substep (a.1) forward Load Match (LM$_F$) is derived using the following equation:

$$LM_F = \frac{s11_{measured} - \dfrac{DIR_F}{TS^2}}{RT_F + (SM_F \times (s11_{measured} - DIR_F))}$$

where TS is the transmission response along a path between test ports and $s11_{measured}$ is the measured value at a first port when a signal is placed on the first port and the first port and a second port are connected in a through path configuration.

13. A method for performing calibration of a network analyzer system, the method comprising the following steps:
(a) performing an initial calibration for test ports of the network analyzer system comprising the following substeps:
(a.1) performing a measurement calibration using calibration standards, the calibration standards being located in a reference plane located outside the network analyzer system, the measurement calibration yielding initial calibration coefficients, the initial calibration coefficients including:
Reverse Load Match (LM$_R$)
(a.2) measuring electronic standards within the network analyzer system to produce initial measured electronic standards, including:
Reverse Offset Load Match (OLM$_R$), and
(a.3) using the initial calibration coefficients and the measured electronic standards to generate initial corrected electronic standards; and,
(b) performing an automatic recalibration for the test ports, the automatic recalibration being performed after initial calibration of all the test ports in step (a), the automatic recalibration being performed without accessing calibration standards located in a reference plane located outside the network analyzer system and the automatic recalibration comprising the following substeps:
(b.1) measuring the electronic standards within the network analyzer system to produce recalibration measured electronic standards, and
(b.2) using the recalibration measured electronic standards and the initial corrected electronic standards to produce recalculated calibration coefficients, wherein Reverse Offset Load Match (OLM$_R$) is used to produce a recalibration Reverse Load Match (LM$_R$).

14. A method as in claim 13 wherein in substep (b.2) Reverse Offset Load Match (OLM$_R$) is used with a re-computed internal reverse load match (LM$_R$ (internal)) to produce a recalibration Reverse Load Match (LM$_R$ (self_cal)) using the following equation:

$$LM_R(\text{self\_cal}) = LM_R(\text{internal}) + OLM_R.$$

15. A method as in claim 13 wherein in substep (a.1) reverse Load Match (LM$_R$) is derived using the following equation:

$$LM_R = \frac{s22_{measured} - \dfrac{DIR_R}{TS^2}}{RT_R + (SM_R \times (s22_{measured} - DIR_R))}$$

where $s22_{measured}$ is the measured value at the second port when a signal is placed on the second port and the first port and the second port are connected in the through path configuration.

* * * * *